(12) United States Patent
Salahuddin et al.

(10) Patent No.: US 11,374,058 B2
(45) Date of Patent: Jun. 28, 2022

(54) MEMORY SELECTOR AND MEMORY DEVICE INCLUDING SAME

(71) Applicant: IMEC vzw, Leuven (BE)

(72) Inventors: Shairfe Muhammad Salahuddin, Leuven (BE); Alessio Spessot, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/559,501

(22) Filed: Sep. 3, 2019

(65) Prior Publication Data
US 2020/0075676 A1 Mar. 5, 2020

(30) Foreign Application Priority Data
Sep. 4, 2018 (EP) .................. 18192451

(51) Int. Cl.
*H01L 27/24* (2006.01)
*H01L 45/00* (2006.01)
(Continued)

(52) U.S. Cl.
CPC ...... *H01L 27/2463* (2013.01); *H01L 27/2409* (2013.01); *H01L 29/872* (2013.01);
(Continued)

(58) Field of Classification Search
CPC ............ H01L 27/2463; H01L 27/2409; H01L 29/872; H01L 43/10; H01L 45/06;
(Continued)

(56) References Cited

U.S. PATENT DOCUMENTS 7,303,971 B2 12/2007 Hsu et al.
8,952,470 B2 2/2015 Lupino et al.
(Continued)

FOREIGN PATENT DOCUMENTS

WO WO 2016/068745 A1 5/2016
WO WO 2018/004587 A1 1/2018

OTHER PUBLICATIONS

Yoon et al., "Strong Fermi-Level Pinning at Metal/n-Si(001) Interface Ensured by Forming an Intact Schottky Contact with a Graphene Insertion Layer", Nano Letters, vol. 17, No. 1, pp. 44-49, 2017.
(Continued)

*Primary Examiner* — David Vu
*Assistant Examiner* — Brandon C Fox
(74) *Attorney, Agent, or Firm* — Knobbe, Martens, Olson & Bear, LLP

(57) ABSTRACT

The disclosed technology generally relates to a memory selector and to a memory device including the memory selector, and more particularly to the memory selector and the memory device implemented in a crossbar memory architecture. In one aspect, a memory selector for a crossbar memory architecture comprises a metal bottom electrode, a metal top electrode and an intermediate layer stack between and in contact with the metal top and bottom electrodes. A bottom Schottky barrier having a bottom Schottky barrier height ($\Phi_B$) is formed at the interface between the metal bottom electrode and the intermediate layer stack. A top Schottky barrier having a top Schottky barrier height ($\Phi_T$) is formed at the interface between the metal top electrode and the intermediate layer stack. The disclosed technology further relates to a random access memory (RAM) and a memory cell including the memory selector.

19 Claims, 6 Drawing Sheets

(51) Int. Cl.
*H01L 43/10* (2006.01)
*H01L 29/872* (2006.01)

(52) U.S. Cl.
CPC .............. *H01L 43/10* (2013.01); *H01L 45/06* (2013.01); *H01L 45/1253* (2013.01); *H01L 45/141* (2013.01); *H01L 45/147* (2013.01); *H01L 45/148* (2013.01)

(58) Field of Classification Search
CPC . H01L 45/1253; H01L 45/141; H01L 45/147; H01L 45/148
USPC .......................................................... 257/5
See application file for complete search history.

(56) References Cited

U.S. PATENT DOCUMENTS

| | | | | |
|---|---|---|---|---|
| 10,008,665 | B1* | 6/2018 | Gealy | G11C 13/0069 |
| 10,269,442 | B1* | 4/2019 | Tortorelli | H01L 27/2463 |
| 2013/0094278 | A1* | 4/2013 | Hou | G11C 17/16 |
| | | | | 365/148 |
| 2014/0264239 | A1* | 9/2014 | Ananthan | G11C 13/0069 |
| | | | | 257/4 |
| 2015/0333196 | A1 | 11/2015 | Shin et al. | |
| 2016/0149129 | A1* | 5/2016 | Bodke | H01L 27/2409 |
| | | | | 257/4 |
| 2016/0336378 | A1* | 11/2016 | Ohba | G11C 13/003 |
| 2019/0123273 | A1* | 4/2019 | Lee | H01L 45/1616 |
| 2019/0386203 | A1* | 12/2019 | Gosavi | G11C 11/161 |
| 2020/0027504 | A1* | 1/2020 | Sharma | H01L 45/16 |
| 2021/0074825 | A1* | 3/2021 | Sharma | H01L 45/1233 |

OTHER PUBLICATIONS

Search Report dated Feb. 15, 2019 in European Patent Application No. 18192451.5; 8 pages.

* cited by examiner

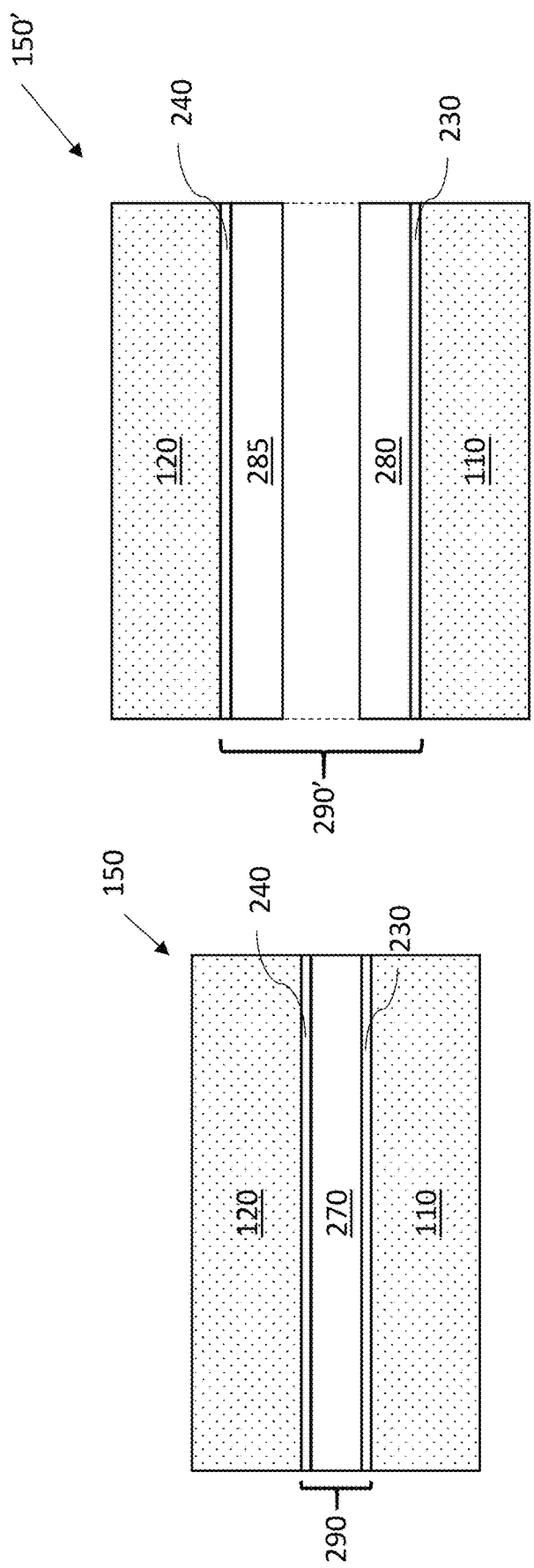

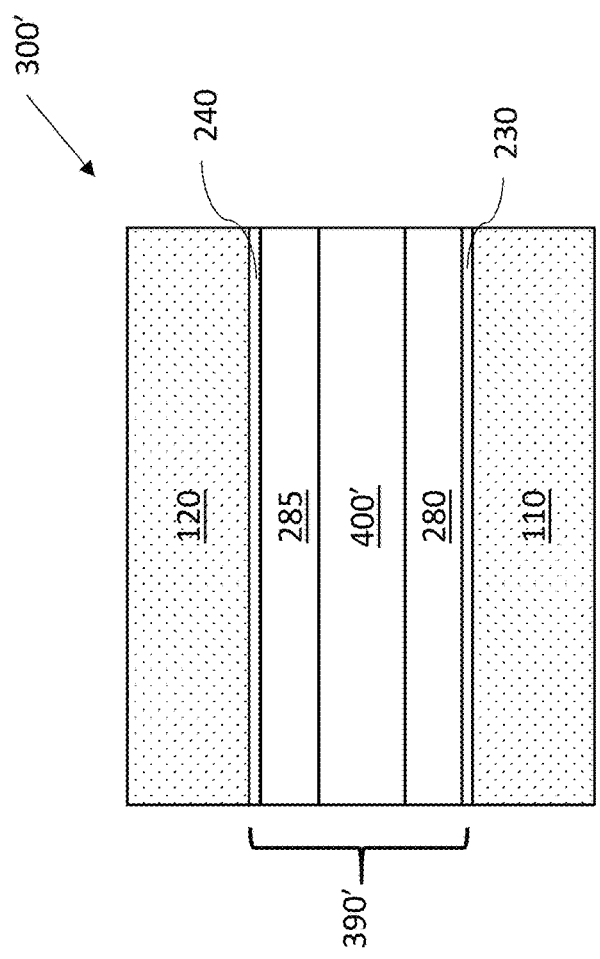
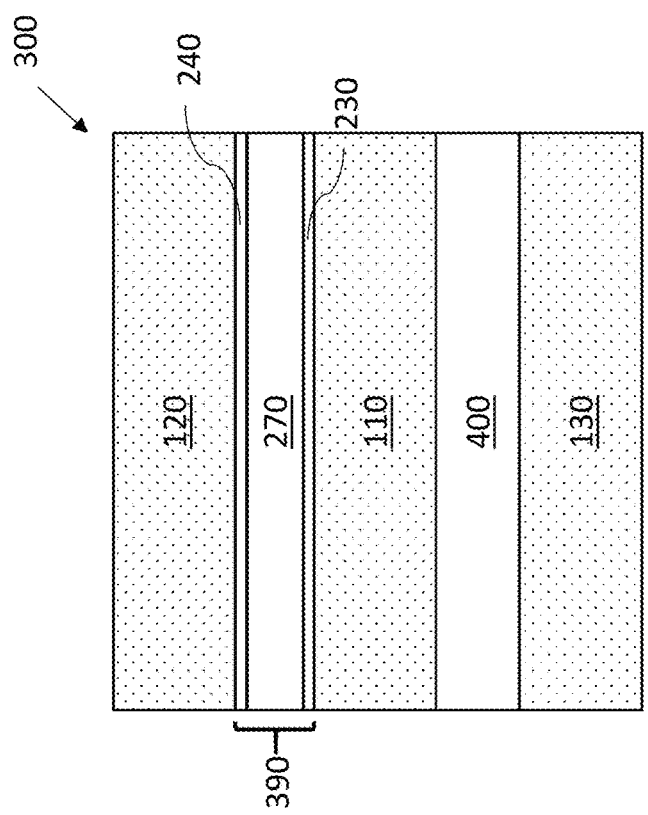
Fig. 5B
Fig. 5A

MEMORY SELECTOR AND MEMORY DEVICE INCLUDING SAME

CROSS-REFERENCE TO RELATED APPLICATIONS

This application claims foreign priority to European Application No. EP 18192451.5, filed Sep. 4, 2018, the content of which is incorporated by reference herein in its entirety.

BACKGROUND

Field

The disclosed technology generally relates to a memory selector and to a memory device including the memory selector, and more particularly to the memory selector and the memory device implemented in a crossbar memory architecture.

Description of the Related Technology

Process architectures for memory or storage devices, e.g., storage class memory devices, that may be particularly adapted for continued scaling with the scaling of lithographically definable feature dimensions include a crossbar architecture, which may also be referred to as a cross-point architecture. A random access memory having a crossbar architecture includes an array of memory cells, a plurality of word lines extending along columns (or rows) of the memory cells, and a plurality of bit lines extending along rows (or columns) of the memory cells. The word and bit lines may overlie or cross each other but are spaced from each other in a vertical direction. A memory cell may be formed at a cross-point of a word line and a bit line. The memory cell may include a memory selector in series with a storage unit for storing a bit. The memory selector and storage unit connected in series are electrically coupled to the word line at one terminal and to the bit line at the opposite terminal.

A back-to-back Schottky diode is a device that permits current flow in both forward and reverse directions under higher voltage (forward and reverse) bias conditions, but blocks current under lower voltage bias conditions. The use of back-to-back Schottky diodes as a memory selector in random access memory arrays has been disclosed. For example, this has been disclosed in Sheng et al (U.S. Pat. No. 7,303,971) for resistance random access memory (RRAM), and Lupino et al. (U.S. Pat. No. 8,952,470) for magnetic random access memory (MRAM). However, there is a need for improved back-to-back Schottky diode with reduced metal diffusion, reduced thickness variation and/or reduced thermal crosstalk.

A metal-semiconductor-metal (MSM) back-to-back Schottky diode includes a metal bottom electrode, a metal top electrode and selector material arranged in-between and in contact with the electrodes. A bottom Schottky barrier having a bottom Schottky barrier height ($\Phi_B$) may be formed at the interface between the metal bottom electrode and an intermediate layer stack. A top Schottky barrier having a top Schottky barrier height ($\Phi_T$) may be formed at the interface between the metal top electrode and the intermediate layer stack.

SUMMARY OF CERTAIN INVENTIVE ASPECTS

It is an aim of the present disclosure is to provide an improved memory selector.

It may be an aim of the present disclosure to reduce metal diffusion, to reduce thickness variation and/or to suppress thermal crosstalk. Additional and alternative aims may be understood from the following.

The present disclosure provides a memory selector, which may be integrated in a crossbar memory architecture, having a metal-semiconductor-metal (MSM) back-to-back Schottky diode. The diode includes: a metal bottom electrode, a metal top electrode and an intermediate layer stack arranged between, e.g., in contact with, the electrodes. A bottom Schottky barrier having a bottom Schottky barrier height ($\Phi_B$) may be formed at the interface between the metal bottom electrode and the intermediate layer stack. A top Schottky barrier having a top Schottky barrier height ($\Phi_T$) may be formed at the interface between the metal top electrode and the intermediate layer stack. According to the present disclosure, the intermediate layer stack comprises one or more atomic layers of at least one two-dimensional (2D) material at the interface with at least one of the electrodes. Each atomic layer forms or modulates the respective Schottky barrier height.

The present disclosure provides a single-layer or few layers of at least one two-dimensional (2D) material at the interface between an intermediate layer stack and the metal bottom electrode and/or between the intermediate layer stack and the metal top electrode. The two-dimensional material may be selected from the group consisting of a two-dimensional semiconductor material, a two-dimensional insulator material, and any other suitable 2D material. As described herein, a 2D material may include a layered compound. A layered compound may include a 2D molecular or atomic monolayer, which may also be referred to as a 2D molecular or atomic sheet. Each monolayer or sheet may have atoms that form chemical bonds, e.g., metallic bonds or covalent bonds, with each other in the in-plane directions. However, the 2D molecular or atomic monolayer or sheets may form weak bonds, e.g., van der Waals interactions, with vertically adjacent 2D molecular or atomic monolayers or sheets, or other materials, in the out-of-plane directions. One example of a 2D material is a transition metal chalcogenide, e.g., a transition metal dichalcogenide (or TMD), denoted by $MX_2$ with M a transition metal and X a chalcogenide. Examples of $MX_2$ material include $WS_2$, $MoS_2$, $WSe_2$, $MoSe_2$, $WTe_2$ and $MoTe_2$.

For the purposes of this disclosure, the term "single-layer" refers to a 1 atomic layer (monolayer) whereas "few layers" refers to a layered structure with 2-10 layers of atoms. Each atomic layer forms or modulates respectively the bottom Schottky barrier height ($\Phi_B$) or the top Schottky barrier height ($\Phi_T$).

According to the present disclosure, the presence of a 2D material at the interface with the metal may provide a barrier layer to reduce metal diffusion into the selector material, thickness-induced characteristic variation, and/or thermal crosstalk in the vertical direction. In some embodiments, owing to the nonlinear current-voltage (IV) characteristic, the 2D material may advantageously include a 2D semiconductor that may be used as the selector material forming a Schottky barrier. This may further eliminate the need for high temperature processing such that the integration of the 2D material is compatible with back end of line, BEOL, process. Advantageously, the fabrication cost may be reduced.

In a first aspect, which may be combined with the other aspects and embodiments described herein, the atomic layers are barrier formation layers. Each barrier formation layer is adapted to influence, e.g. increase or decrease, the respective Schottky barrier height between the respective electrode and a semiconductor layer present in the intermediate layer stack. The semiconductor material may be selected from the group consisting of two-dimensional semiconductor material, silicon (Si), indium gallium zinc oxide (IGZO), octadecyltrichlorosilane (OTS), and any other suitable oxide.

In an embodiment according to the present disclosure, the one or more atomic layers comprise multiple layers of different two-dimensional materials. For example, the different two-dimensional (2D) materials may comprise graphene and a 2D semiconductor material. In some embodiments, the 2D material may be omit graphene.

In a second aspect, which may be combined with the other aspects and embodiments described herein, the intermediate layer stack comprises one or more atomic layers of at least one two-dimensional (2D) material at the interface with the metal bottom electrode and the metal top electrode. Therefore, the atomic layers comprise one or more bottom layers at the interface with the bottom electrode and one or more top layers at the interface with the top electrode.

In an embodiment according to the present disclosure, the at least one two-dimensional bottom material and the at least one two-dimensional top material comprise the same two-dimensional material.

In another embodiment according to the disclosure, the at least one two-dimensional bottom material and the at least one two-dimensional top material comprise different two-dimensional materials.

In embodiments according to the disclosure, the back-to-back Schottky diode comprises symmetric or asymmetric Schottky barrier heights. The bottom Schottky barrier height ($\Phi_B$) may be in the range of 0.1 eV to 1.0 eV, in particular in the range of 0.25 eV to 0.75 eV. The top Schottky barrier height ($\Phi_T$) may be in the range of 0.1 eV to 1.0 eV, in particular in the range of 0.25 eV to 0.75 eV.

In a third aspect, which may be combined with the other aspects and embodiments described herein, the intermediate layer stack consists of exactly one layer of 2D-material. The 2D-material may be a 2D-material semiconductor forming the bottom Schottky barrier of the metal bottom electrode and a top Schottky barrier of the metal top electrode.

The present disclosure further relates to a memory cell comprising a storage unit for storing a bit and a memory selector as described above for controlling the access to the storage unit. The storage unit may be in contact with the metal bottom electrode or the metal top electrode, or the storage unit may be interposed in the semiconductor layer.

The present disclosure further relates to a random access memory (RAM) having a crossbar architecture comprising a plurality of memory cells as described above, wherein the RAM is one selected from the group consisting of a resistive random access memory (RRAM), a magnetic random access memory (MRAM), a phase change random access memory (PC RAM), and a conducting bridge random access memory (CB RAM).

BRIEF DESCRIPTION OF THE DRAWINGS

The invention will be explained in more detail below with reference to drawings in which illustrative embodiments thereof are shown. They are intended exclusively for illustrative purposes and not to restrict the inventive concept, which is defined by the appended claims.

FIGS. 4A and 4B are partial cross-sectional views of a further alternative embodiment of a back-to-back Schottky diode;

FIGS. 5A and 5B are partial cross-sectional views of embodiments of a memory cell with a MSM back-to-back Schottky diode according to the present disclosure.

DETAILED DESCRIPTION OF CERTAIN ILLUSTRATIVE EMBODIMENTS

Figure 1:
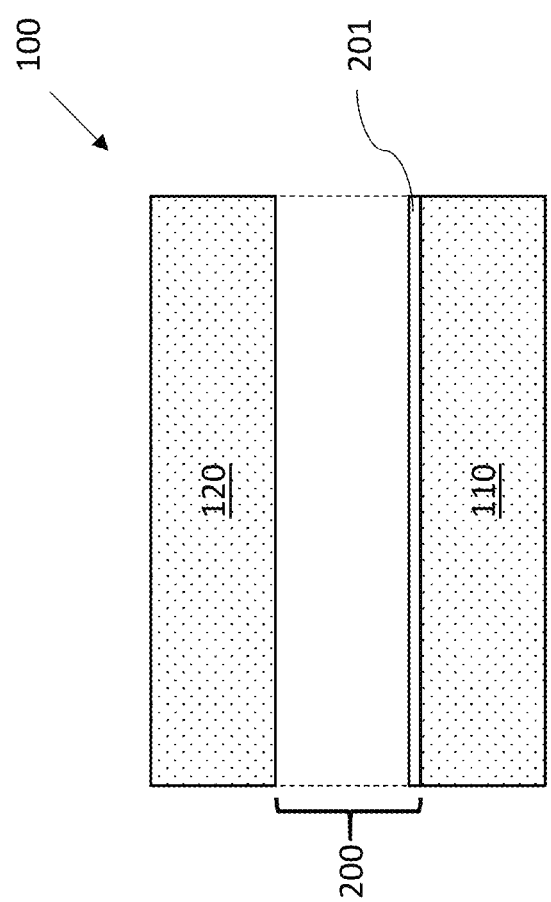
FIG. 1 is a partial cross-sectional view of an embodiment of a metal-semiconductor-metal (MSM) back-to-back Schottky diode according to the present disclosure.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

Furthermore, the various embodiments, although referred to as "preferred" are to be construed as exemplary manners in which the invention may be implemented rather than as limiting the scope of the invention.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present invention, the only enumerated components of the device are A and B, and further the claim should be interpreted as including equivalents of those components.

FIG. 1 is a partial cross-sectional view of a metal/semiconductor/metal (MSM) back-to-back Schottky diode, according to embodiments. The back-to-back Schottky diode 100 is a vertical diode comprising a metal bottom electrode 110, a metal top electrode 120 and an intermediate layer stack 200 arranged between and in contact with the metal top and bottom electrodes 110, 120. The vertical diode is arranged such that the current in the conducting state flows mainly in a direction perpendicular to a main plane of the diode. Advantageously, the footprint of the diode is reduced.

The metal top electrode 120 and the metal bottom electrode 110 form, respectively, a top Schottky barrier having a top Schottky barrier height ($\Phi_T$) and a bottom Schottky barrier having a bottom Schottky barrier height ($\Phi_B$).

The intermediate layer stack 200 comprises at least one layer. In the embodiment shown in FIG. 1, the stack 200 comprises a bottom layer 201 of a two-dimensional (2D) material arranged in contact with the bottom electrode 110. Alternatively, or in combination, the stack 200 could also comprise a top layer (not shown) of a two-dimensional (2D) material arranged in contact with the top electrode 120.

In various embodiments described herein, the metal top electrode 120 and the metal bottom electrode 110 may be formed of materials such as Pt, Au, Ag, Ru, TiN, Ta, or TaN. However, other materials that are well known in the art for use as a conductive electrode, may also be used for the top and/or bottom electrodes. In some embodiments, the metal top electrode 120 and metal bottom electrode 110 may be formed of the same material and, therefore, have identical work functions. As described herein, work function is a measure of the minimum energy, as expressed in electron volts (eV), needed to remove an electron from a metal at the Fermi level.

The 2D-material may be a two-dimensional semiconductor material, a two-dimensional insulator material, or any other suitable 2D material such as graphene. In particular, when the two-dimensional material is a two-dimensional semiconductor material, the material may be a molybdenite, $MoS_2$, or any other suitable material. In some other embodiments, the 2D material may omit graphene.

In the embodiments described herein, the intermediate layer stack 200 may have a thickness in the range of about 0.6 nanometers, nm, to 12.0 nm, in particular about 6.0 nm. The metal top electrode 120 and metal bottom electrode 110 may each have a thickness in the range of about 1.0 to 100.0 nm. The metal top electrode 120 need not necessarily be the same thickness as the metal bottom electrode 110.

Figure 2B:
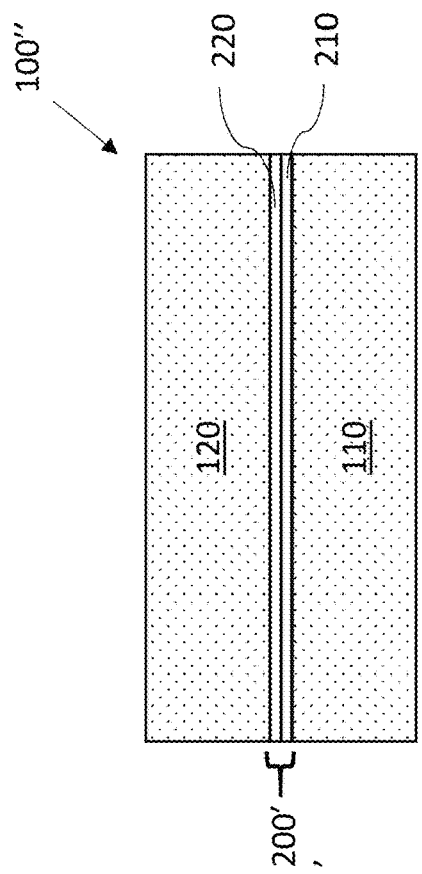
FIGS. 2A and 2B are partial cross-sectional views of an alternative embodiments of a back-to-back Schottky diode.
Figure 2A:
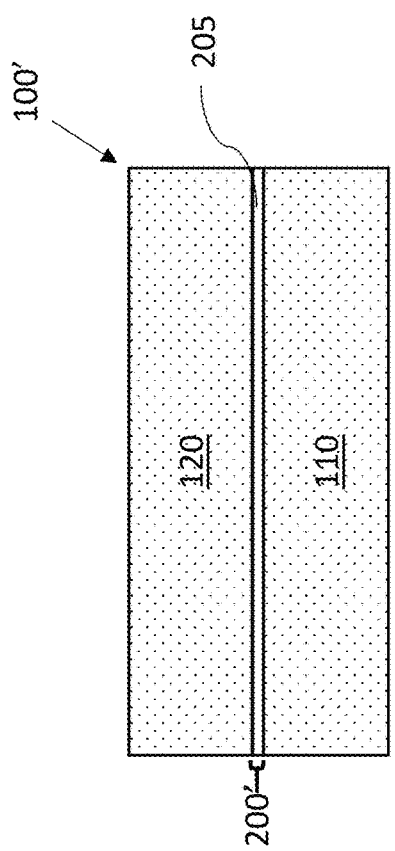

FIGS. 2A and 2B are partial cross-sectional views of a back-to-back Schottky diode according to some other embodiments. These Schottky diodes 100', 100" include all the elements of the diode shown in FIG. 1. The intermediate layer stacks 200', 200" comprises at least one semiconductor layer 205 (FIG. 2A) or semiconductor layers 210, 220 (FIG. 2B) of a two-dimensional (2D) semiconductor material arranged between and in contact with at least one of the electrodes 110, 120.

In the embodiment illustrated in FIG. 2A, the intermediate layer stack 200' comprises a single layer 205 of 2D semiconductor material. The layer 205 forms the bottom Schottky barrier and the top Schottky barrier.

In the embodiment illustrated in FIG. 2B, the intermediate layer stack 200" comprises a plurality of layers comprising a bottom layer 210 of a 2D semiconductor material at the interface with the metal bottom electrode 110, where the bottom layer 210 forms the bottom Schottky barrier, and the top layer 220 of a 2D semiconductor material at the interface with the metal top electrode, where the top layer 220 forms the top Schottky barrier. The bottom layer 210 and the top layer 220 may be formed of different two-dimensional semiconductor materials. The 2D semiconductor material may be, e.g., molybdenite, $MoS_2$, $MoSe_2$, $WS_2$, $WSe_2$, GaSe, GaTe, FeTe, or any other suitable material.

Figure 3:
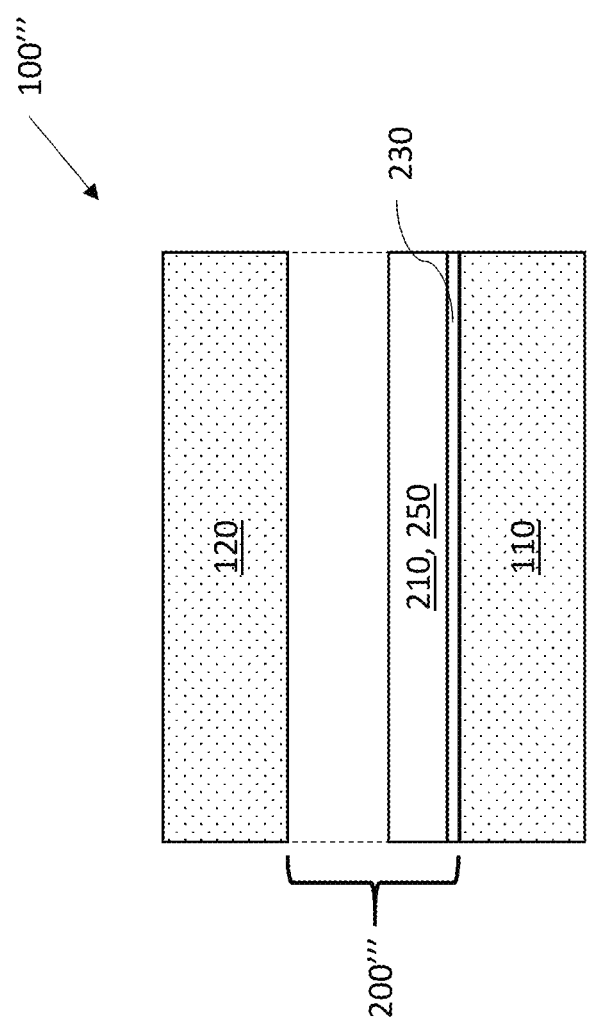
FIG. 3 is partial cross-sectional view of another alternative embodiment of a back-to-back Schottky diode.

FIG. 3 is a partial cross-sectional view of another back-to-back Schottky diode, according to some other embodiments. This alternative Schottky diode 100''' includes all the elements of the diode shown in FIG. 1. The intermediate layer stack 200''' comprises at least one barrier formation layer stack 230 of 2D material arranged between and in contact with at least one of the electrodes 110; 120, where at least one barrier formation layer stack 230 is adapted to modify or influence, e.g., increase or decrease, the Schottky barrier between a semiconductor layer 210, 250 and the respective electrode. In some embodiments, the barrier formation layer stack 230 may comprise a single layer of 2D material or a few layers of 2D material.

FIGS. 4A and 4B are partial cross-sectional views of further alternatives of the back-to-back Schottky diode according to embodiments. These alternatives Schottky diodes 150, 150' include all the elements of the diode shown in FIG. 3. The intermediate layer stack 290, 290' comprises a bottom barrier formation layer stack 230 of 2D material at the interface with the metal bottom electrode 110 and a top barrier formation layer stack 240 of 2D material at the interface with the metal top electrode 120.

In the embodiment depicted in FIG. 4A, the intermediate layer stack 290 includes a single layer 270 of 2D semiconductor material, where the semiconductor layer 270 is arranged between and in contact with the bottom barrier formation layer stack 230 and the top barrier formation layer stack 240.

In the embodiment depicted in FIG. 4B, the intermediate layer stack 290' comprises a bottom layer 280 of a semiconductor material forming the bottom Schottky barrier and a top layer 285 of a semiconductor material forming the top Schottky barrier. In between the bottom and top layers of semiconductor material 280, 285, conductive material (not shown) may be provided forming a conductive path between the bottom and top layers of semiconductor material 280, 285, or a memory device may be present such that the diode may act as a selector for that memory device.

FIG. 5A is a partial cross-sectional view of a memory cell 300, according to some embodiments. The memory cell 300 includes a selector as shown in one of the figures above, in particular a selector as shown in FIG. 4A. The memory cell 300 further comprises a storage unit 400 for storing a bit in connection to the diode. The storage unit may be arranged to and in contact with one of the electrodes 110, 120 and a further electrode 130.

Alternatively, as shown in FIG. 5B, a storage unit 400' may be provided in the intermediate layer stack 390' of a selector as shown in FIG. 4B between a bottom layer 280 of a semiconductor material or octadecyltrichlorosilane (OTS) and a top layer 285 of a semiconductor material or OTS. The semiconductor material may for example be indium gallium zinc oxide (IGZO).

Figure 6:
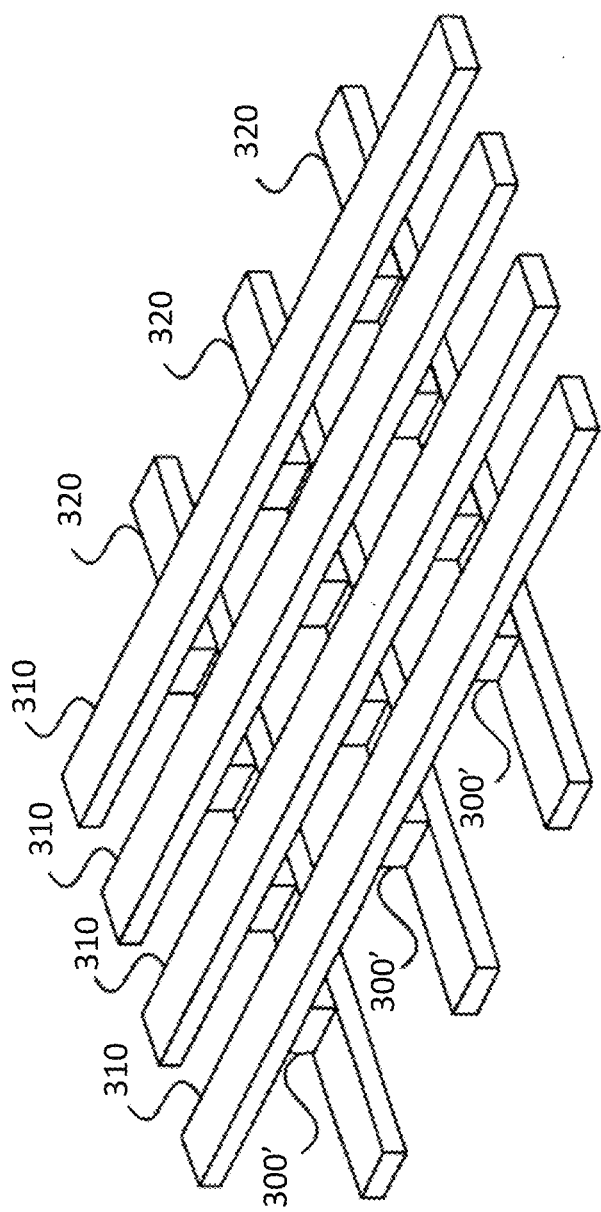
FIG. 6 is schematic view of a random access memory (RAM) having a crossbar architecture having memory cell with an MSM back-to-back Schottky diode, according to embodiments of the present disclosure.

FIG. 6 is schematic perspective view of a random access memory (RAM), having a crossbar architecture having memory cell with a MSM back-to-back Schottky diode, according to embodiments. A crossbar memory architecture is a matrix of memory cells 300', with electrical contacts arranged along X-axes (e.g., word lines 310) and along y-axes (e.g., bit lines 320). In embodiments, a digital value may be stored as a memory resistance (high or low). The memory state of a memory cell can be read by supplying a voltage to the word line connected to the selected memory element. The resistance or memory state can be read either as an output voltage or current of the bit line connected to the selected memory cell. In embodiments, the RAM may be a resistive random access memory (RRAM) comprising a resistance change storage element, e.g., a resistance change oxide, a magnetic random access memory (MRAM) comprising a magnetic storage element, e.g., a spin-torque transfer memory (STTM) element, a phase change random access memory (PC RAM) comprising a phase change storage element, e.g., a chalcogenide storage element, or a conducting bridge random access memory (CB RAM) comprising a conductive bridge storage element, e.g., a metal filament-forming storage element.

In FIG. 6, the combination of a memory cell 300' and a selector is shown as a block-shaped structure. The structure may for example be as shown in FIGS. 5A and 5B, with the top electrode 120 forming the word line 310 and the bottom electrode 110 forming the word line 320. In alternative embodiments, the selectors of FIGS. 1-4B, or other selectors as disclosed herein, may be used within the scope of the present disclosure.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A memory selector comprising back-to-back Schottky diodes for a crossbar memory architecture, the memory selector comprising:
   a metal bottom electrode, a metal top electrode and an intermediate layer stack arranged between and in contact with the metal top and bottom electrodes;
   a bottom Schottky barrier having a bottom Schottky barrier height ($\Phi_B$) formed at an interface between the metal bottom electrode and the intermediate layer stack; and
   a top Schottky barrier having a top Schottky barrier height ($\Phi_T$) formed at an interface between the metal top electrode and the intermediate layer stack,
   wherein the intermediate layer stack comprises a semiconductor layer interposed between one or more atomic layers of at least one two-dimensional (2D) material different from the semiconductor layer formed on both sides of the semiconductor layer, such that the one or more atomic layers are formed at both of interfaces between the semiconductor layer and the metal top and bottom electrodes, and
   wherein the at least one 2D material comprises a 2D material other than graphene.

2. The memory selector according to claim 1, wherein the one or more atomic layers are barrier formation layers, each barrier formation layer being adapted to form or modulate a respective Schottky barrier height between the respective electrode and the semiconductor layer in the intermediate layer stack.

3. The memory selector according to claim 2, wherein the semiconductor layer is selected from the group consisting of a 2D semiconductor material, silicon (Si), indium gallium zinc oxide (IGZO) and octadecyltrichlorosilane (OTS).

4. The memory selector according to claim 1, wherein the one or more atomic layers comprise multiple layers of 2D materials.

5. The memory selector according to claim 1, the one or more atomic layers comprising:
   one or more bottom layers of at least one 2D bottom material at the interface between the intermediate layer stack and the bottom electrode, the one or more bottom layers forming or modulating the bottom Schottky barrier height ($\Phi_B$); and
   one or more top layers of at least one 2D top material at the interface between the intermediate layer stack and the top electrode, the one or more top layers forming or modulating the top Schottky barrier height ($\Phi_T$).

6. The memory selector according to claim 5, wherein the at least one 2D bottom material and the at least one 2D top material comprise the same 2D material.

7. The memory selector according to claim 5, wherein the at least one 2D bottom material and the at least one 2D top material comprise different 2D materials.

8. The memory selector according to claim 1, wherein the back-to-back Schottky diodes comprise symmetric top and bottom Schottky barrier heights or asymmetric top and bottom Schottky barrier heights.

9. The memory selector according to claim 1,
   wherein the bottom Schottky barrier height ($\Phi_B$) is 0.1 eV to 1.0 eV, and/or
   wherein the top Schottky barrier height ($\Phi_T$) is 0.1 eV to 1.0 eV.

10. The memory selector according to claim 9, wherein one or both of the bottom Schottky barrier height ($\Phi_B$) and the top Schottky barrier height ($\Phi_T$) is 0.25 eV to 0.75 eV.

11. The memory selector according to claim 1, wherein the 2D material other than graphene is a 2D semiconductor material or a 2D insulator material.

12. The memory selector according to claim 1, wherein the 2D material other than graphene is a transition metal chalcogenide.

13. The memory selector according to claim 1, wherein the 2D material other than graphene is a 2D semiconductor material selected from the group consisting of molybdenite, $MoS_2$, $MoSe_2$, $WS_2$, $WSe_2$, GaSe, GaTe and FeTe.

14. The memory selector according to claim 1, wherein the intermediate layer stack consists of one layer of the 2D material other than graphene, the 2D material other than graphene being a 2D semiconductor material forming the bottom Schottky barrier with the metal bottom electrode and the top Schottky barrier with the metal top electrode.

15. A memory cell comprising a storage unit for storing a bit and a memory selector according to claim 1 for controlling the access to the storage unit.

16. The memory cell according to claim 15, wherein the storage unit is in contact with the metal bottom electrode or the metal top electrode.

17. The memory cell according to claim 15, wherein the storage unit is interposed between semiconductor layers.

18. A random access memory (RAM), comprising a crossbar architecture comprising at least two memory cells according to any claim 15, wherein the RAM is one selected from the group consisting of resistive random access memory (RRAM), magnetic random access memory (MRAM), phase change random access memory (PC RAM) and conducting bridge random access memory (CB RAM).

19. The RAM of claim 18, wherein each of the at least two memory cells is formed vertically between a word line and a bit line at a crossing therebetween.

\* \* \* \* \*